MICROWAVE SWITCHING DEVICE EMPLOYING A SEMICONDUCTOR DIODE

Filed May 31, 1968

INVENTOR.
SHIGETOKI SUGIMOTO
BY
Hopgood & Calimafde
ATTORNEYS

INVENTOR.
SHIGETOKI SUGIMOTO
BY
Hopgood & Calimafde
ATTORNEYS

INVENTOR.
SHIGETOKI SUGIMOTO
BY
Hopgood & Calimafde
ATTORNEYS

INVENTOR.
SHIGETOKI SUGIMOTO
BY
Hopgood & Calimafde
ATTORNEYS

INVENTOR.
SHIGETOKI SUGIMOTO 3,559,117

MICROWAVE SWITCHING DEVICE EMPLOYING A SEMICONDUCTOR DIODE

Shigetoki Sugimoto, Tokyo, Japan, assignor to Nippon Electric Company, Ltd., Tokyo, Japan, a company of Japan Filed May 31, 1968, Ser. No. 733,590
Claims priority, application Japan, June 6, 1967, 42/36,135; June 23, 1967, 42/40,300; June 25, 1967, 42/48,319; Sept. 26, 1967, 42/83,440; Oct. 25, 1967, 42/69,301
U.S. Cl. 333—98 1 Claim

ABSTRACT OF THE DISCLOSURE

A semiconductor microwave switching device is described wherein a junction diode is placed in a waveguide and operated at least for one switch position with a bias voltage which is lower than the breakdown voltage. A specific installation of the diode in a millimeter waveguide is described.

This invention relates to a semiconductor diode switching device for microwaves and specifically for those within the millimeter-wave region. The invention further relates to a microwave pulse modulating device.

Various improvements in high-speed digital communication systems have been proposed in order to provide a system capable of transmitting a great amount of information. The millimeter-wave PCM communication system employing circular waveguides, described in a paper entitled "Waveguide as a Communication Medium" disclosed by S. E. Miller in the Bell System Technical Journal Vol. 33, pp. 1209–1265 (1954), is an example of the results of such proposed improvements. In designing a millimeter-wave PCM communication system, the transmitting power output is one of the key factors in determining the spatial interval of the repeaters. Also, the clock frequency of the millimeter-wave PCM signal should be as high as possible to reduce the number of filters and the like necessarily included in each of the repeaters and to reduce the transmission power loss introduced between the transmitter and receiver. In this respect, the clock frequency is another of the important factors in determining the spatial interval of the repeaters. It will be understood that the total manufacturing cost of a communication system is lowered, as the output power of each repeater becomes larger and as the clock frequency is increased.

On the other hand, various solid-state elements for producing ultra-frequency oscillation, such as the Gunn diode, the LSA diode and IMPATT diode, are rapidly developing. It is expected that the oscillation power of several ten to several hundred milliwatts will be obtained in the near future in the millimeter region. Therefore, it is a problem for the engineers in this technical field to find suitable devices for applying the above-mentioned solid-state oscillation elements to the millimeter-wave PCM communication system.

In the high-speed digital communication system heretofore proposed, the clock frequency is in the VHF or UHF regions; for example, 224 mHz, as proposed in a paper "Experimental 224 Mb./S. PCM Terminals" disclosed by J. S. Mayo in the Bell System Technical Journal, vol. 44, pp. 369–372 (February 1965). In the Mayo system, the transient time of the carrier signal or, in other words, the rise time and fall time of the carrier pulse (encoded information signal) should be as short as 1 nanosecond at the microwave pulse modulation stage. However, it has not been reported that microwave pulses with such a short transient time are ever obtained by direct modulation of the above-mentioned solid-state oscillators with a high switching ratio; for instance more than 26 db.

It is proposed that the output of a continuous oscillation obtained with the solid-state oscillator be modulated by means of a separate modulator. One of the most effective high-speed pulse modulators for the separate modulation use is the so-called semiconductor diode switching device, which has been used for the microwave switching.

In the conventional device of the kind, the bias voltage of a semiconductor diode, which is electromagnetically coupled with a microwave, is switched from a value $V_1$ (in the forward bias or positive region) to another value $V_2$ (in the backward bias region) higher, in the algebraic sense, than the breakdown voltage of the diode, or vice versa from $V_2$ to $V_1$, to obtain the desired pulse modulation. For example, the Garver device disclosed in the paper "Microwave Semiconductor Switching Techniques," IRE Transactions on Microwave Theory and Techniques, MTT–6, pp. 378–383 (October 1958), employs a point-contact diode, setting the voltages $V_1$ and $V_2$ at +1.5 v. and −1.5 v., respectively. In the Garver device, it is apparent from FIG. 3 of the paper that the voltage $V_2$ is higher than the breakdown voltage of the diode. Also, the Millet device described in the paper "Microwave Switching by Crystal Diodes," IRE Transaction on Microwave Theory and Techniques, MTT–6, pp. 284–290 (July 1958), employs a point-contact type diode (IN38), setting the voltages $V_1$ and $V_2$ at +4 v. and −75 v., respectively. The lower bias voltage −75 v. is, as shown in the characteristics of the diode IN38, apparently higher than its breakdown voltage.

On the other hand, application of the diode switch to the microwave switching field is rarely reported, particularly in the millimeter-wave region. In the C. A. Burrus's paper "Millimicrosecond Pulses in the Millimeter Wave Region," Review of Scientific Instruments, vol. 28, pp. 1062–1065 (December 1957), it is reported that a carrier wave pulse having a width of 3 nanoseconds is obtained at a carrier frequency of 55 gHz. In the reported device, however, the power derivable at the output terminal is only 5 mw., while the input power is 16 mw. This means that the power loss is very large. Also, nothing is mentioned in his paper about the details of the diode employed except that it is a silicon point-contact diode mounted on a millimeter-wave wafer-type holder (see "Wafer-Type Millimeter Wave Rectifiers," Bell System Technical Journal, vol. 35, pp. 259–270 (November 1956) referred to in the Burrus paper), and that the lower voltage $V_2$ is −.5 v. Generally, a wafer-type holder is very difficult to make mechanically rigid. Moreover, when the semiconductor diode deteriorates, the holder must be replaced in its entirety. Because of these difficulties, the wafer-type holder is not suitable for practical use as compared with the so-called cartridge-type diode. With these facts in view, the Burris device does not appear to have any practical advantage.

As described in the foregoing, it has been the practice to employ a point-contact diode as a microwave switching diode. Therefore, the lower bias voltage $V_2$ is chosen to be higher than the breakdown voltage $V_z$. The reason for this is that the application of the voltage lower than the breakdown voltage $V_z$ to the diode is apt to electrically destroy the diode.

In order for the diode switch of the kind suggested to be operative at the microwave region, especially at the so-called millimeter-wave region, the semiconductor diode should have the cut-off frequency several times as high as the microwave frequency. To raise the cut-off frequency of the point-contact diode, the point-contact area should be made as small as possible. This is realized only at the cost of a reduced allowable current (maximum power) and less mechanical strength of the diode.

Therefore, it is an object of this invention to provide a microwave diode switching device for operation in the millimeterwave region, with a reduced power loss and increased mechanical strength.

Briefly, my invention resides in employing the junction-type diode as a microwave diode switch. Since the junction type diode has a high mechanical strength, the structure of the point-contact diode is no longer a problem.

The inherent low cut-off frequency of the junction diode is equivalently raised as will be described hereafter and thereby the frequency and power are not lowered by the introduction of the junction-type diode. Furthermore, it should be noted that the junction diode employed in the present invention is available in the market at a price lower than the point-contact diode employed in the conventional device.

The present invention is based on a principle as follows.

It is well known that application to a certain junction-type diode of a bias voltage lower than its breakdown voltage brings about the so-called avalanche effect. As a result, the inductive susceptance and negative conductant components appear at the junction, as described in T. Misawa's paper entitled "Negative Resistance in p-n Junction Under Avalanching Breakdown Conditions, Part 1," IEEE Transactions on Electron Devices, ED–13, pp. 137–143 (January 1966). The inductive susceptance component serves to cancel the capacitive susceptance of the barrier capacitance, while the negative conductance component serves to reduce the diffusion resistance. Thus, these components serve to raise the virtual cut-off frequency of the diode, enabling us to provide a microwave switching device of high efficiency. In other words, the junction-type diode is employed in the present invention, taking advantage of its above-mentioned properties.

It is therefore a further object of this invention to provide an economical microwave power switch with low insertion loss and high switching ratio.

The invention will be explained with reference to the accompanying drawings in which:

FIGS. 1*a* and 1*b* are an equivalent circuit diagram of a junction-type semiconductor diode employed in the invention;

FIG. 2(*b*) shows a longitudinal sectional view (partly in side view) seen from the dot-dash line of FIG. 2(*a*) in the direction of arrows;

Figure 1A:
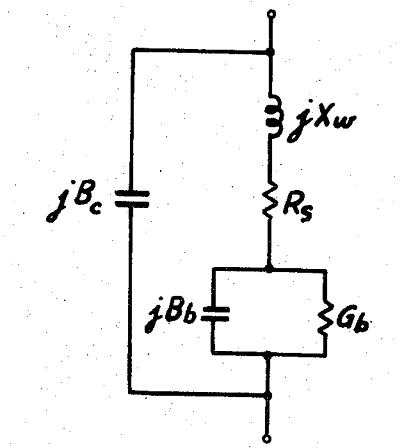
Figure 1B:
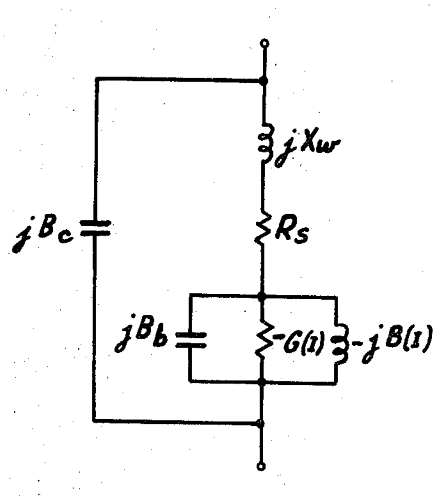

FIG. 1(*a*) shows an equivalent circuit of a junction diode biased in the backward bias region at the switching bias voltage $V_2$ higher than the breakdown voltage. FIG. 1(*b*) shows the similar equivalent circuit for the case where the bias voltage $V_2$ is lower than the breakdown volage. According to FIG. 1(*a*) and the above-mentioned Millet paper, the equivalent circuit for the bias voltage $V_2$ higher than the breakdown voltage is composed of: a series circuit comprising an inductive reactance $jX\omega$ introduced by the central conductor, a diffusion resistance $R_s$, a barrier conductance $G_b$, and a susceptance $jB_b$ component of a barrier capacitance $C_b$; and a susceptance $jB_c$ shunting said series circuit introduced by the cartridge structure. As has been mentioned, the cut-off frequency $f_c$ of the diode depends on the barrier capacitance $C_b$ and diffusion resistance $R_s$. More specifically, the relation $$f_c=\frac{1}{R_sC_b}$$

holds. On the other hand, it is known that the above-mentioned quantities $B_b$ and $C_b$ vary depending on the bias voltage of the diode.

In the equivalent circuit shown in FIG. 1(*b*) of the junction diode biased to the voltage lower than its breakdown voltage, the barrier conductance $G_b$ appearing in FIG. 1(*a*) is replaced by a negative conductance $-G(I)$ and an inductive susceptance $-jB(I)$ introduced due to the avalanche effect. As is mentioned in the above-mentioned T. Misawa's paper, these two quantities depend on the current flowing through the barrier. For this reason, the quantity $B_b$ which is the factor in determining the cut-off frequency becomes equivalent to $B_b-B(I)$. Furthermore, the effective value of $R_s$ is reduced owing to the effect of $-G(I)$. Consequently, the cut-off frequency $f_c$ is effectively raised. In some cases, the frequency elevation reaches an oscillation state due to the fact that the power supplied by $-G(I)$ exceeds the power dissipated by $R_s$ (such phenomenon is reported by R. L. Johnston in his paper "A Silicon Diode Microwave Oscillator," Bell System Technical Journal Vol. 44, pp. 369–372 (February 1956)).

Figure 2A:
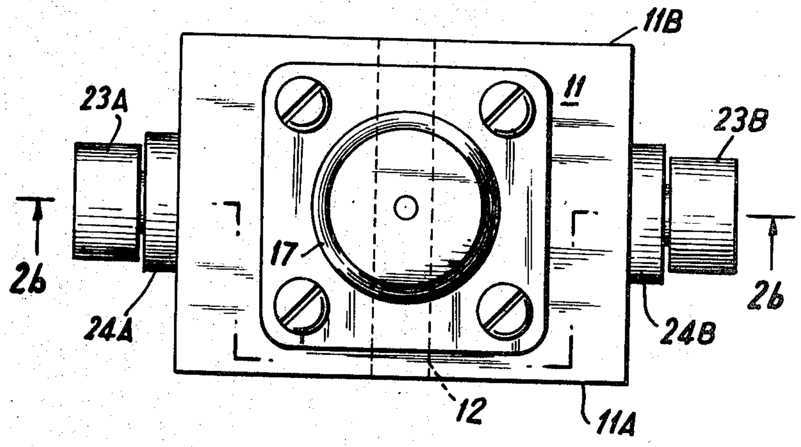
FIG. 2(*a*) shows a plan view of the principal portion, the diode holder portion, of an embodiment of the invention.
Figure 2B:
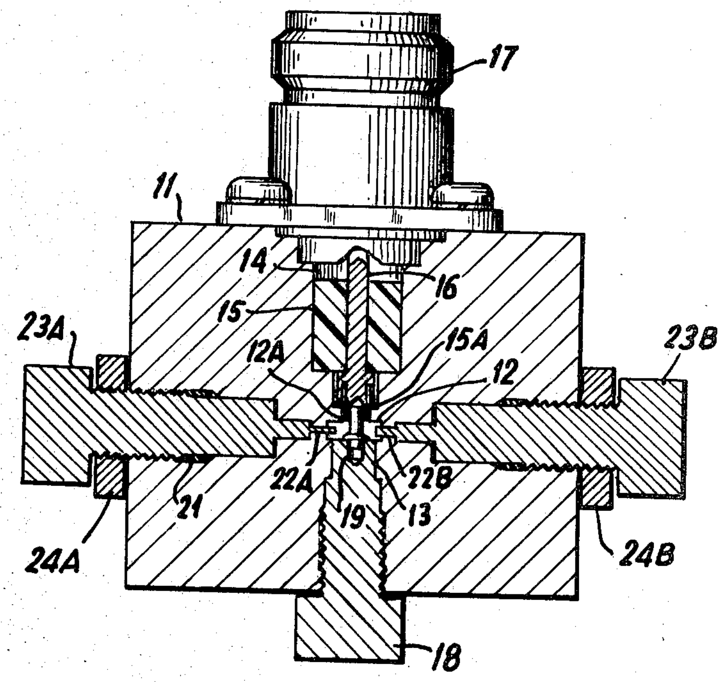

Referring to FIG. 2, the principal portion of a microwave diode switch of the invention has a parallellepiped conductor block 11 comprising a waveguide portion 12, which lies in a plane perpendicular in FIG. 2(*b*) to the sheet of drawings and in a plane parallel (as shown by dotted line) in FIG. 2(*a*) to the sheet. A plurality of tapped holes formed on the upper and lower surfaces 11B and 11A for fixing the flanges of the external waveguides are omitted in the drawing for facilitating illustration.

Junction-type semiconductor diode 13 employed as the switching element should be supported, as is well known, at the central portion of the conductor block 11 in the direction parallel to the height of the waveguide portion 12.

For this purpose, an aperture 14 is formed in the same direction at the center of the block 11. In the upper half of this aperture 14, a hollow cylindrical holder ring 15 made of Teflon is inserted to support an inner conductor 16 along the axis line of the aperture 14. The lower tip of the conductor 16 admits the upper electrode of the diode 13. The inner conductor 16 is connected with a switching signal source (not shown) through a coaxial connector 17 fixed to the conductor block 11. The lower electrode of the diode 13 is brought into stable contact with a spacer 19 buried in the upper end portion of supporting member 18, which is screw-fixed to the tapped aperture 14. In fixing the diode 13 at the position indicated in the drawing, the inner conductor 16 is first inserted along with holder ring 15 from the coaxial connector 17 side of the aperture 14. Then the connector 17 is fixed to the conductor block 11, rigidly fixing the inner conductor 16 between itself and a Teflon ring 15A inserted at the lower tip thereof. Next, the diode 13 is inserted into the aperture 14 until it is thoroughly engaged with the lower-end portion of the inner conductor 16. The screw 18 is then screw-fixed to the threaded wall of the aperture 14 to secure the contact between the lower electrode of the diode 13 and the supporting member 18. Thus, the diode 13 is sufficiently rigidly supported in the space of the waveguide portion 12.

Another aperture 21 is formed in the direction perpendicular to the waveguide 12 and the aperture 14. The interior of the aperture 21 has openings in the waveguide portion 12 at the point where the diode is disposed. Reactive rods 22A and 22B are inserted through the openings into the waveguide portion 12. The protruded lengths of reactive rods 22A and 22B are adjusted by adjusting members 23A and 23B, respectively.

In order to apply to the diode 13 the switching signal or pulse modulating signal supplied from the coaxial connector 17, a cylindrical gap should be formed between the inner conductor 16 and the conductor block 11. To prevent the microwave energy from leaking through this gap, the upper wall portion 12A of the waveguide 12, along with the lower-end portion of the inner conductor 16, is given such a suitable length in the direction of the inner conductor 16 as may constitute a microwave choke.

Since the structure of this microwave diode switch will be quite understandable to those skilled in the art, further description will be omitted.

This diode switch device may be connected to an external microwave circuit by means of external waveguides (not shown), which are fixed to the surfaces 11A and 11B of the conductor block 11 and extend within the plane parallel to the drawing sheet of FIG. 2(*a*). Also, the upper electrode of the diode is connected through the connector 17 to a switching signal source not shown. Several conductor plates of the thickness equal to a quarter wavelength of the input microwave may be inserted between the flange of each of the external waveguides and end surfaces 11A and 11B of the block 11, for impedance-matching purposes. Since the technique of the kind is well known, further description will be omitted. The microwave supplied from the one end 11A of the conductor block 11 is on-off modulated in response to the change in the switching voltage applied to the diode.

In FIG. 2, the diode switching device of the invention is shown on an enlarged scale 1:2. This embodiment is designed to be operative at the 50 gH. region. The actual cross-section of the waveguide is, for example, 4.775 mm. x 2,388 mm. Silver-bonded germanium varactor diodes GSB3B and GSB3C manufactured and available from Nippon Electric Company, Ltd., are used as diode 13. Each of these diodes has a structure such that the semiconductor element is encapsulated in a miniature cylindrical cartridge which has at the middle portion thereof an insulative ceramic ring and a small flange formed at the lower electrode side of the diode. To mention principal characteristics of these diodes at an ambient temperature of 25° C., the minimum forward current $I_F$ is 100 ma. for a forward voltage of IV; maximum backward current $I_R$ 1 $\mu$a. for a backward voltage of 1 v.; minimum backward voltage $V_R$ 6 v. for a backward current of 50 $\mu$a.; maximum capacitance C 0.3 pf. at the bias voltage of 0 volts; and lowest cut-off frequency $f_c$ for a backward voltage of 5 v. is 100 gHz. (GSB3B) or 140 gHz. (GSB3C). As indicated in FIG. 2, the diode 13 is supported at its flange of the cartridge by the upper end portion of the supporting screw member 18.

In order to take advantage of the above-mentioned characteristics of the junction-type diode which is biased at a voltage lower than the breakdown voltage, the lower and upper limit values of the switching voltage must suitably be determined. In other words, at least the lower limit value must be set at a voltage lower than the breakdown voltage (about −9 v. in both the exemplified diodes).

The results of a series of experiments will be detailed hereunder, which prove the technical advantage of the present diode switch device and determine the upper and lower limit values of the switching voltage. The adjustments and measurements were made as follow: output of a millimeterwave klystron was set at the prescribed frequency and power level and led to the diode switch. The bias voltage of the diode was swept at 50 Hz., while the power transmitted through the switch was detected and indicated on an X–Y oscilloscope. In order to achieve the best performance, the protruded lengths of the reactive rods 22A and 22B and the thickness of the spacer 19 were adjusted. Such adjustment is not difficult to carry out, as will be apparent from FIG. 2.

The attenuation was measured by a method commonly used in this technical field. A pair of waveguide switches were used to alternatively connect the present switch device and a calibrated variable attenuator with the common measuring circuit. The readings of the attenuator adjusted to give the same value of the detected voltage as what was given when the switch device was connected were employed as the attenuation values of the present device. To measure the detected voltage, a millivolt meter was employed.

Figure 3:
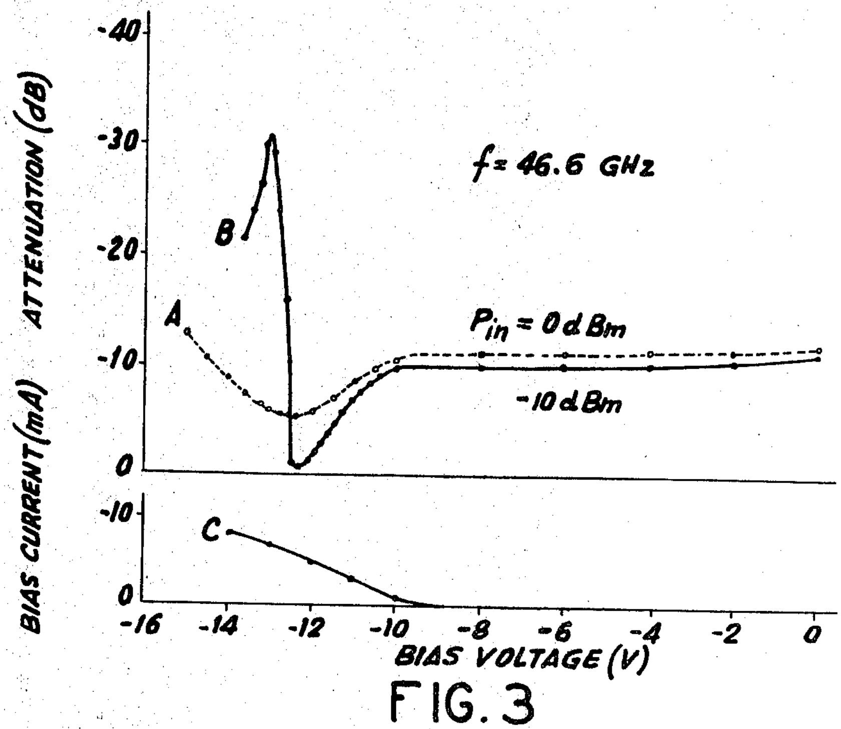
FIGS. 3, 4 and 5 show the attenuation vs. bias voltage characteristics of the first, second and third examples of the diode switch fabricated according to the present invention, respectively.

In FIG. 3, in which the abscissa indicates the bias voltage $V_B$ (volt), first ordinate the bias current (ma.) and the second ordinate the attenuation, the bias current vs. bias voltage characteristics C and the attenuation vs. bias voltage characteristics A and B of the first example of the present diode switch are shown. The frequency of the input microwave in this case is 46.6 gHz. Among these characteristic curves, the curves A and B indicate the results where the millimeter-wave power inputs are 0 $db_m$ and −10 $db_m$, respectively. As will be obvious from the drawings, the feature of the present switching device is remarkably presented by the curve B. More particularly, the attenuation at the bias voltage −12.3 v. is only 0.6 db from zero, whereas the attenuation at the bias −13.0 v. reaches 30.8 db. Therefore, a bias voltage switched between −12.3 v. and −13 v. enables the present device to serve as a microwave switching device. (The increase in the bias current does not cause any trouble because, as shown in curve C, its maximum value at the bias voltage −13 v. is not greater than 7 ma.) In other words, the microwave at the frequency 46.6 gHz. can be pulse-modulated by a pulse signal having amplitude of 0.7 v. peak-to-peak. In this example, both the upper and lower limits of the switching voltage of the diode are set below the breakdown voltage, which is about −9 v. in the case of the diode GSB3B.

Figure 4:
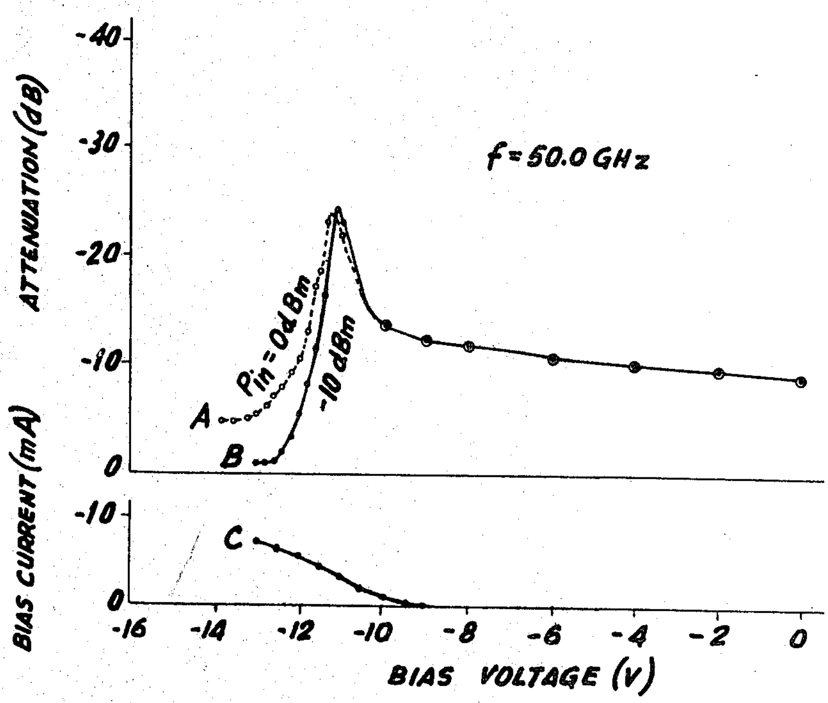

Next, the characteristics of the second example of the present diode switch are shown in FIG. 4 which has the abscissa, ordinates and symbols identical to those of FIG. 3. In this case, the diode GSB3C is employed and the input frequency is 50 gHz. Also, the microwave circuit of the present switching device is adjusted so that the maximum and minimum attenuations are obtained at the upper and lower limit values of the switching voltage, both of which values are lower than the breakdown voltage of the diode. More particularly, the maximum attenuation 24.4 db is observed at the lower limit value of the bias voltages −11.1 v. and the minimum attenuation is seen at the lower bias voltage −12.8 v. As will be obvious from these characteristic curves, 1.7 v. is sufficient for the peak-to-peak value of the switching voltage.

It will be understood from the curves B of FIGS. 3 and 4 that the first and second examples present excellent switching characteristics if the input microwave level is kept as low as −10 $db_m$. As is shown by the curves A of FIGS. 3 and 4, however, the attenuation or switching characteristics are deteriorated as the input microwave power is increased. Therefore, these two examples are effective for the microwave switching of relatively low power.

Figure 5:
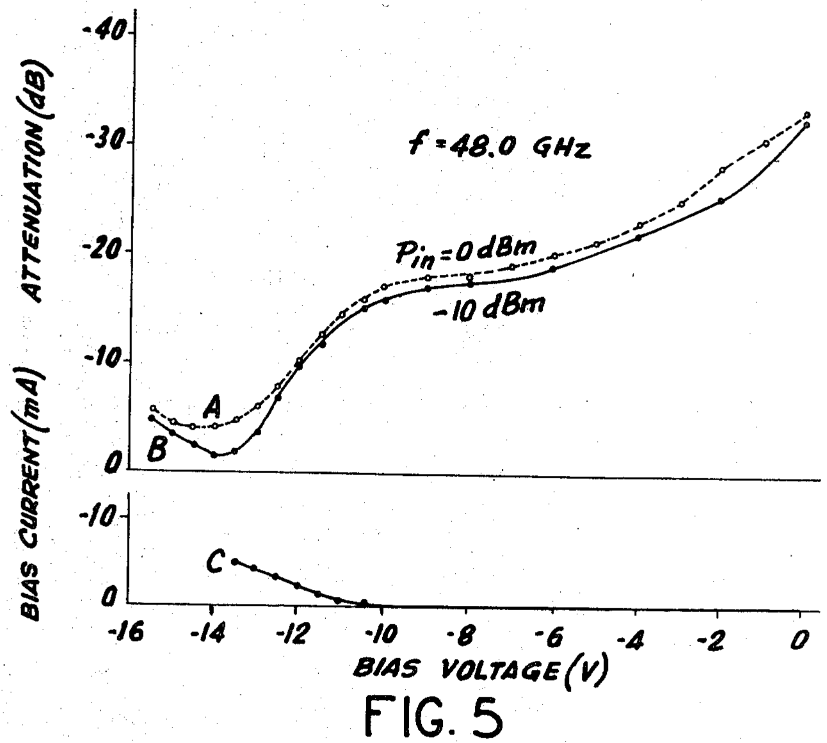

The characteristics of the third example adjusted to have sufficient switching effect even for larger microwave input power is shown in FIG. 5, in which the abscissa, ordinates and symbols are similar to those in FIGS. 3 and 4. This example employs GSB3C as diode 13 and is designed to control the input microwave at 48.0 gHz. As will be understood from this characteristic the maximum attenuation 33.4 db and minimum attenuation 1.7 db are obtained at bias voltages 0 v. and −14.0 v. (lower than the breakdown voltage −9 v.), respectively. It should be noted here that the characteristic curve A for the input power 0 $db_m$ substantially coincides with the curve B for the input power −10 $db_m$. This coincidence indicates that this switching element is operative over a relatively wide input microwave power range.

Figure 6:
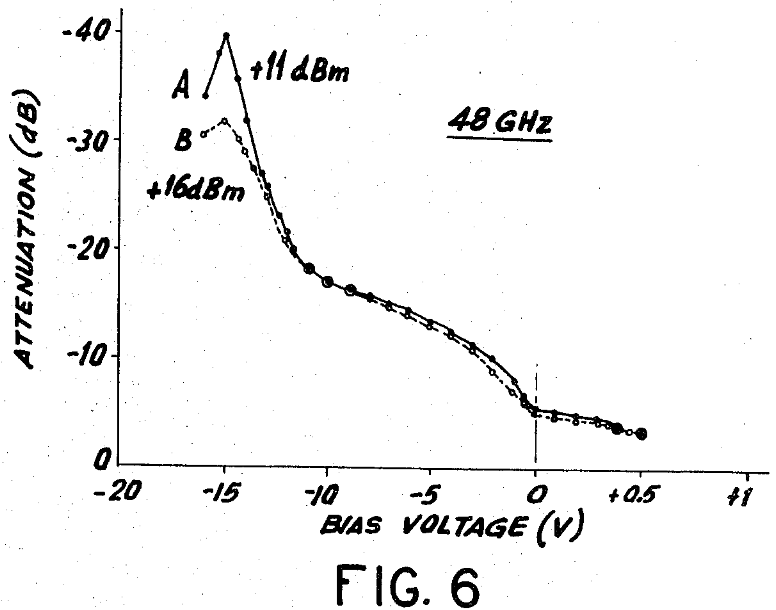
FIGS. 6, 7 and 8 show the attenuation vs. bias voltage characteristics, attenuation vs. input power characteristics, and corresponding attenuation vs. frequency characteristics of a preferred embodiment.

The attenuation characteristic curve of the fourth and most preferred example is shown in FIG. 6, in which the abscissa, ordinates and symbols are similar to those in FIGS. 3, 4 and 5. This example also employs GSB3C as diode 13, and is designed to control the input microwave at 48.0 gHz. The curves A and B are the attenuation characteristics for the input microwave power +11 $db_m$ and +16 $db_m$, respectively.

At first, it is understood from the curve A that, for the input power +11 $db_m$, the maximum attenuation 40 db is observed at bias voltage −15 v. (lower than the breakdown voltage), while the minimum attenuation is 3.5 db at bias voltage +0.5 v. Also, the curve B shows that this attenuation characteristic is not deteriorated even when the input power is increased to +16 $db_m$. To clarify this input power withstanding property, the explanation will be given further with reference to FIG. 7.

Figure 7:
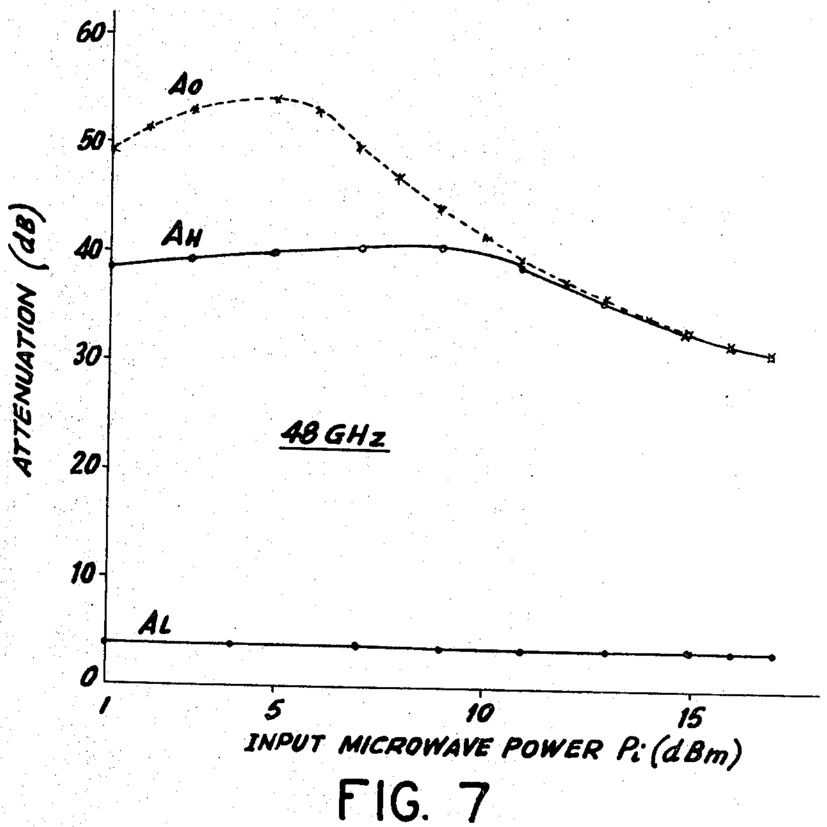

In FIG. 7, the input microwave power is indicated in the abscissa, while the attenuation is in the ordinate. A curve $A_L$ indicates the attenuation vs. input microwave power characteristic of the above-mentioned fourth example, with the diode bias voltage +0.46 v. (corresponding to the minimum attenuation shown in FIG. 6) kept constant as a parameter. In other words, the curve $A_L$ shows the change in the minimum attenuation caused by the change in the input microwave power. Similarly, the curve $A_H$ indicates the variation in the attenuation with the diode bias voltage −15.3 v. (corresponding to the maximum attenuation shown in FIG. 6) kept constant as a parameter. Also, the curve $A_O$ indicates the similar attenuation characteristic, in which only the diode bias voltage is adjusted to give the maximum attenuation, every time the input microwave power is changed. It is understood from this characteristic that sufficiently satisfactory attenuation characteristics can be obtained even if the input microwave power is increased to +17 $db_m$ and that such characteristics would not be appreciably deteriorated even when the power input is raised to +20 $db_m$.

Figure 8:
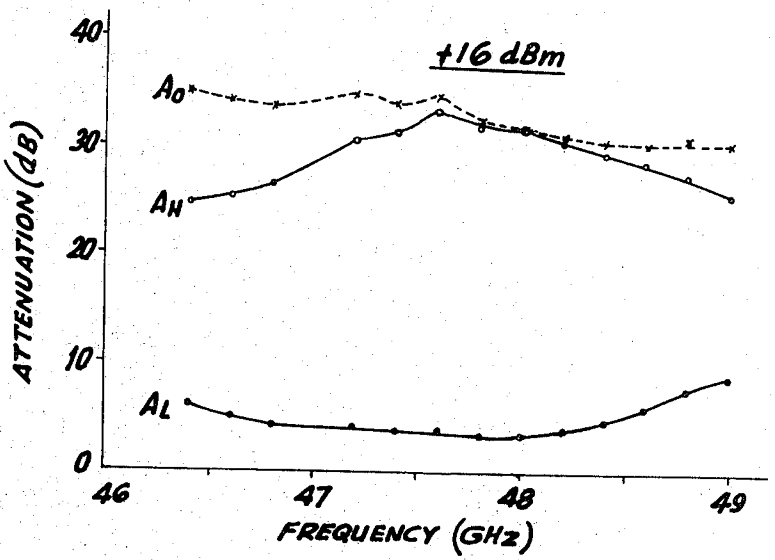

Next, the attenuation vs. frequency characteristics of the most preferred embodiment are shown in FIG. 8. In this drawing, the abscissa indicates the input microwave frequency while the ordinate indicates the attenuation similarly to FIG. 7. It is apparent from these curves that this fourth example has excellent frequency characteristics.

The pulse response time of this example has been measured under the condition that the input microwave frequency is 47 to 48 gHz., input microwave power +17 $db_m$, the diode bias current less than 10 ma., and the switched output microwave is envelope-detected by a microwave diode IN53B. The result proves that both the turn-on time and the turn-off time are about 1 nanosecond. This result shows that the fourth example satisfies the requirements of the high-speed transmission system described in the preamble of this specification.

Although the characteristics of the four examples so far described are measured by using the present diode switch as a transmission-type switching device (the input microwave power is transmitted from one end of the waveguide portion 12 to the other), it will be apparent to those skilled in the art that similar characteristics can be obtained even when it is used as a reflection-type switching device.

Now, the present microwave switching device as applied to a microwave pulse modulator device will be described.

Figure 9:
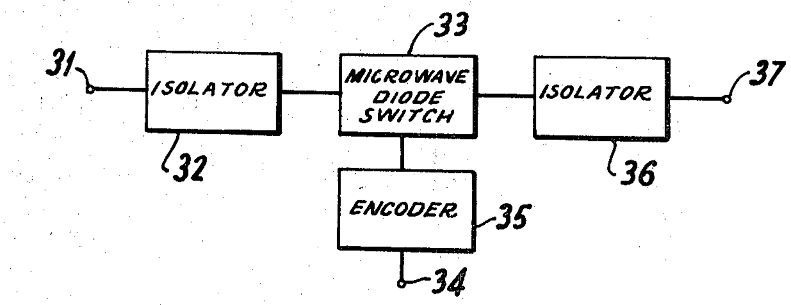
FIGS. 9 and 10 are block diagrams of microwave pulse modulating devices in which the present diode switch finds application.

In the example of FIG. 9, the present switching device is used as a transmission-type switching element. A microwave supplied to an input terminal 31 from a microwave carrier source not shown is applied to the present microwave diode switch 33 through an isolator 32. On the other hand, an information signal supplied to an information input terminal 34 is encoded by encoder 35 to a pulse modulating signal having peak-to-peak value sufficient to switch the junction diode of the switching device. The modulating signal is applied to switch device 33 as the bias control voltage for the diode of the switch device 33. Resorting to the aforementioned switching effect of the switch device 33, the input microwave power is on-off modulated, which is then led to an output terminal 37 through another isolator 36.

Figure 10:
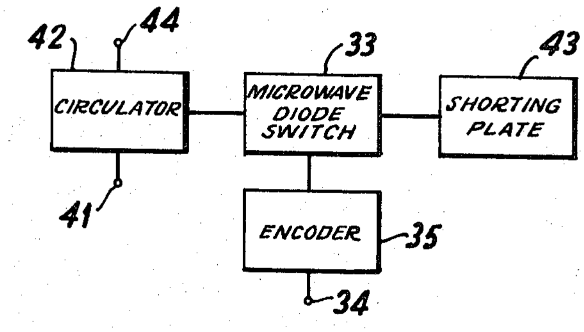

In the example of FIG. 10, the present switching device is used as a reflection-type microwave modulator. In this practical application, an input microwave supplied from an input terminal 41 is applied to the diode switch device 33 through a circulator 42. To the diode of the diode switch device 33, the coded information signal is supplied from the encoder 35 in the form of a switch-controlling signal, as in the case of FIG. 9. The microwave switched in response to the coded information signal is reflected by an adjustable shorting plate 43 to the input end of the switch device 33, and then derived from an output terminal 44 through the circulator 42. A portion of the microwave having passed through the switch device 33 suffers the multiple reflection caused between shorting plate 43 and switch device 33. However, the influence of the multiple reflection component on the reflected output of the switch device 33 can be suppressed by impedance control of the switching diode.

Although the microwave pulse modulator devices of FIGS. 9 and 10 are mentioned as typical practical applications of the present switching device, it will be apparent to those skilled in the art that it may be also used as a simple microwave switching device.

Since the microwave diode switching device of the invention employs, as has been mentioned above, the junction diode as the switching element, it is not only rigid in structure but applicable to high-power switching. Also, both its frequency characteristics and pulse response characteristics sufficiently satisfy the requirements of the ultra-high carrier frequency and ultra-high-speed digital communication systems.

The embodiments and examples have been described by way of illustration and not as limitations to the technical scope of the invention. It will be obvious to engineers in the art that the various modifications are possible within the scope of the invention. For example, it will be readily understood by the engineers in this field that the present switching device may be used as a pulse-phase modulating means. Therefore, the technical scope of the invention covers all the microwave switching devices set forth in the following claim.

I claim:

1. A semiconductor microwave switching device comprising, a substantially rectangular block of conductive material having a millimeter waveguide portion extending substantially transverse between a pair of parallel faces of the block, said block having a diode mounting aperture in one face thereof and extending substantially transverse in the waveguide portion of the block, said block further being provided with a pair of impedance adjusting apertures extending from opposite sides of the block towards the waveguide portion and terminating therein in the vicinity of the diode mounting aperture, a junction-type diode, means for mounting the diode in the diode mounting aperture and protruding into the waveguide portion with one electrode of the diode in electrical contact with the block and another electrode of the diode insulated from the block and extending therethrough towards a face thereof, a pair of reactive rods adjustably mounted to extend into the waveguide portion through said impedance adjusting apertures, means generating and applying to said diode electrodes a switching voltage having a minimum level and a maximum level, with said minimum level being lower than the breakdown voltage of said diode, whereby a microwave applied from one end of said waveguide portion is substantially modulated in response to said switching voltage.

References Cited

UNITED STATES PATENTS

| | | | |
|---|---|---|---|
| 3,164,792 | 1/1965 | Georgiev et al. | 333—98S |
| 3,266,043 | 8/1966 | Goebels, Jr. | 333—98X |

HERMAN KARL SAALBACH, Primary Examiner

S. CHATMON, Jr., Assistant Examiner

U.S. Cl. X.R.

315—39; 329—161; 333—13